United States Patent
Huang et al.

(10) Patent No.: US 6,541,369 B2
(45) Date of Patent: *Apr. 1, 2003

(54) METHOD AND APPARATUS FOR REDUCING FIXED CHARGES IN A SEMICONDUCTOR DEVICE

(75) Inventors: Judy Huang, Los Gatos, CA (US); Chris Bencher, Sunnyvale, CA (US); Sudha Rathi, San Jose, CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/457,086

(22) Filed: Dec. 7, 1999

(65) Prior Publication Data

US 2002/0081759 A1 Jun. 27, 2002

(51) Int. Cl.$^7$ ............................................... H02L 21/31
(52) U.S. Cl. ....................................................... 438/624
(58) Field of Search ............................... 438/763, 778, 438/931, 952, 940, 624, 636, 638, 700

(56) References Cited

U.S. PATENT DOCUMENTS

| | | | | |
|---|---|---|---|---|
| 4,532,150 A | * | 7/1985 | Endo et al. | 427/39 |
| 4,557,943 A | | 12/1985 | Rosler et al. | 427/38 |
| 4,678,679 A | | 7/1987 | Ovshinsky | 427/38 |
| 4,835,005 A | | 5/1989 | Hirooka et al. | 427/38 |
| 5,010,842 A | | 4/1991 | Oda et al. | 118/723 |
| 5,296,404 A | | 3/1994 | Akahori et al. | 437/173 |
| 5,593,511 A | | 1/1997 | Foster et al. | 148/238 |
| 5,652,166 A | | 7/1997 | Sun et al. | 437/56 |
| 5,741,626 A | * | 4/1998 | Jain et al. | 430/314 |
| 5,818,071 A | * | 10/1998 | Loboda et al. | 257/77 |
| 5,856,240 A | | 1/1999 | Sinha et al. | 438/758 |
| 6,028,012 A | | 2/2000 | Wang | 438/779 |
| 6,054,379 A | * | 4/2000 | Yau et al. | 438/623 |
| 6,140,226 A | | 10/2000 | Grill et al. | 438/637 |
| 6,147,009 A | | 11/2000 | Grill et al. | 438/780 |
| 6,159,871 A | | 12/2000 | Loboda et al. | 438/786 |
| 6,287,990 B1 | | 9/2001 | Cheung et al. | 438/780 |

FOREIGN PATENT DOCUMENTS

| | | | |
|---|---|---|---|
| EP | 0 070 715 | 3/1987 | G03G/5/082 |
| GB | 2 315 158 | 1/1998 | H01L/21/336 |

* cited by examiner

Primary Examiner—Vinh P. Nguyen
Assistant Examiner—Lisa Kilday
(74) Attorney, Agent, or Firm—Moser, Patterson & Sheridan

(57) ABSTRACT

A method and apparatus for reducing trapped charges in a semiconductor device having a first layer and a second layer, said method comprising the steps of providing said first layer, flowing a deposition, a dilution and a conversion gas upon said first layer thereby forming a transition layer, phasing out said flow of conversion gas and forming said second layer upon said transition layer. The deposition gas, dilution gas and conversion gas are preferably trimethylsilane, helium and $N_2O$ respectively. The method is performed via chemical vapor deposition or plasma enhanced chemical vapor deposition. The apparatus has a first insulating layer, a transition layer disposed upon said first layer and a second insulating layer disposed upon said transition layer. The transition layer improves the adhesion between said first insulating layer and said second insulating layer. A reduction in the amount of electrical charges (i.e., ions, electrons or the like) trapped between layers of deposited material improves the integrity and quality of devices formed from such layers.

30 Claims, 6 Drawing Sheets

METHOD AND APPARATUS FOR REDUCING FIXED CHARGES IN A SEMICONDUCTOR DEVICE

BACKGROUND OF THE DISCLOSURE

1. Field of the Invention

The invention relates to the fabrication of semiconductor devices and, more particularly, the invention relates to a method and apparatus for reducing the amount of charges that are trapped between layers of a semiconductor device during its fabrication.

2. Description of the Background Art

Integrated circuits fabricated on semiconductor substrates for Ultra Large Scale Integration (ULSI) require multiple levels of interconnections for electrically connecting the discrete semiconductor devices that comprise the circuits. Conventionally, the multiple levels of interconnections are separated by layers of insulating material. These interposed insulating layers have etched via holes which are used to connect one level of interconnections to another. Typically, the insulating layer material is silicon oxide ($SiO_2$) having a dielectric constant (relative to vacuum) of about 4.1 to 4.5. As device dimensions decrease and the device density increases, it is necessary to reduce the spacing between the interconnection levels to effectively connect the integrated circuits. Unfortunately, as the spacing decreases, the intra- (on the same metal level) and interlevel (between metal levels) capacitances increase when insulating layers therebetween have the same dielectric constant. The capacitance C is inversely proportional to the spacing d between the levels by the relationship $C=keA/d$ where k is the dielectric coefficient, e is the permittivity of the insulator, A is the area, and d is the spacing between lines. Therefore, it is very desirable to minimize the dielectric constant k in the insulating layers between the interconnection layers to reduce the RC time constant and thereby increase the performance of the circuit (frequency response). The signal propagation time in the circuit is adversely affected by the RC delay time, where R is the resistance of the metal line, and C is the inter- and/or the intralevel capacitance mentioned above.

In greater detail, FIG. 1 depicts an integrated circuit device 100 that is presently known in the art. Typically the device 100 is comprised of a substrate material 102 (typically a dielectric material such as $SiO_2$) having a plurality of layers 103 of various materials disposed thereupon. The various layers have different electrical properties so as to create conductive pathways, circuit devices, and the like. For example, a first layer 104 is an insulating layer disposed on top of the substrate 102 acting as a primary insulator. Within the insulating layer 104 are various circuit pathways or circuit devices 106 comprised of conductive material such as titanium or aluminum. Disposed above the insulating and conductive layers, 104 and 106 respectively, is a second insulative layer 108. Typically, the second insulative layer 108 is a dielectric material but not necessarily the same material as the first dielectric layer 104.

One approach to minimize the RC time delays is to use a good electrical conductor for the interconnection levels, such as replacing the titanium or aluminum with copper to reduce resistance R. A second approach is to use an insulating material that has a lower dielectric constant k, such as an organic, to reduce the capacitance C between the interconnection levels. As such, it is highly favorable to use low k dielectric materials for the second insulative layer 108. One example of a typical low k dielectric material that is currently in use for the fabrication of integrated circuits is the compound trimethylsilane (3MS). The dielectric constant of this material is approximately 2.7; therefore, is highly preferred for use as a dielectric material between conductive areas such as conductive pathways and devices and the like represented as 106.

A well known method for creating integrated circuits such as those described above is by chemical vapor deposition (CVD). Typically, a precursor gas is mixed with a carrier gas and introduced to a deposition chamber at an elevated temperature. Upon contact with a substrate 102 within the chamber, the precursor gas decomposes into various elements and reacts with the surface to create the desired material, such as an insulative layer 104, which is typically an oxide, or a conductive material 106 like copper, for example. Such processes may also be enhanced by the use of a plasma within the chamber which provides for a more uniform deposition process, i.e., when filling an opening in an oxide layer 104 with conductor material 106.

The second insulative layer 108 is also formed by CVD or plasma enhanced CVD; however, deficiencies in the process create undesirable results. For example when depositing one oxide material over another, i.e., second insulative layer 108 deposited over first insulative layer 104, different crystal planar structures and dimensions within these two materials create microscopic gaps at an interface 110 of two such layers. FIG. 2 shows an enlarged detail area of FIG. 1 depicting trapped electrical charges 202 at the interface 110 during the CVD process. These trapped charges 202 create a substantial charge buildup condition within the interface 110 which detrimentally effects nearby devices. For example FIG. 3 depicts a graph of capacitance vs. gate voltage of a device (i.e., the gate structure of a MOSFET transistor device) indicating a flat band voltage of approximately −55 V. Since the charge trapping condition is difficult to avoid, a typical and acceptable value for flat band voltage is approximately −15 V. If there are many such trapped charges 202 at the interface 110, devices constructed on the substrate are detrimentally effected resulting in poor or non-operational condition of such devices.

Therefore, there is a need in the art for a method of semiconductor IC construction and resultant apparatus having low k dielectric material to increase insulative properties, yet not creating the charge trap phenomenon at an interface between such low k dielectric material and other insulative materials used to construct such a device.

SUMMARY OF THE INVENTION

The disadvantages associated with the prior art are overcome with the present invention of a method for reducing trapped charges in a semiconductor device having a first layer and a second layer, said method comprising the steps of providing said first layer, flowing a deposition, a dilution and a conversion gas upon said first layer thereby forming a transition layer, phasing out said flow of conversion gas and forming said second layer upon said transition layer. The deposition gas, dilution gas and conversion gas are preferably trimethylsilane, helium and $N_2O$ respectively. Additionally, the step of phasing out the conversion gas flow alters the characteristics of the transition layer. The method is formed via chemical vapor deposition or plasma enhanced chemical vapor deposition when depositing the transition layer, first and second layers.

Alternately, a method for reducing trapped charges in a semiconductor device having a first layer and a second layer, said method comprising the steps of providing the first layer, flowing a deposition and dilution gas upon said first layer to form a transition layer thereupon, applying a plasma treatment to said transition layer, and forming said second layer upon said transition layer. The deposition gas and dilution gas are preferably trimethylsilane and helium respectively. Additionally, the plasma treatment further comprises a $N_2O$ plasma conducted in a range of approximately 50 to 500 watts and preferably 250 watts. The second layer is preferably a trimethylsilane oxide layer.

An apparatus for reducing trapped charges in a semiconductor device is also disclosed. This apparatus has a first insulating layer, a transition layer disposed upon said first layer and a second insulating layer disposed upon said transition layer. The transition layer improves the adhesion between said first insulating layer and said second insulating layer and said transition layer is preferably a silicon carbide based material and most preferably SiC:H. The second insulating layer is trimethylsilane oxide.

With the method and apparatus described in the subject invention, a reduction in the amount of electrical charges (i.e., ions, electrons or the like) trapped between layers of deposited material is realized. As such, the integrity and quality of devices formed from such layers is improved.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
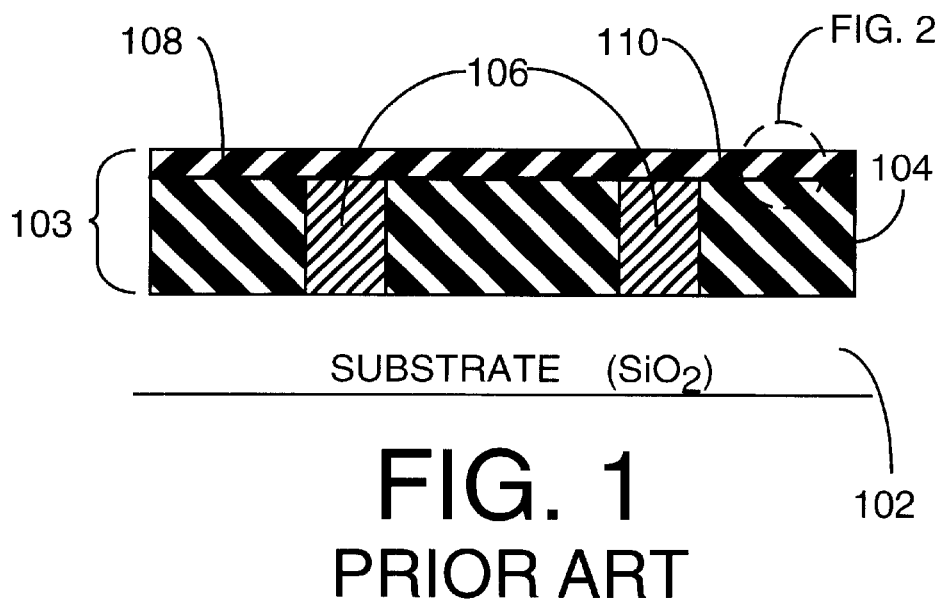
FIG. 1 depicts a partial cross sectional view of a prior art semiconductor substrate having an integrated circuit constructed thereupon.
Figure 2:
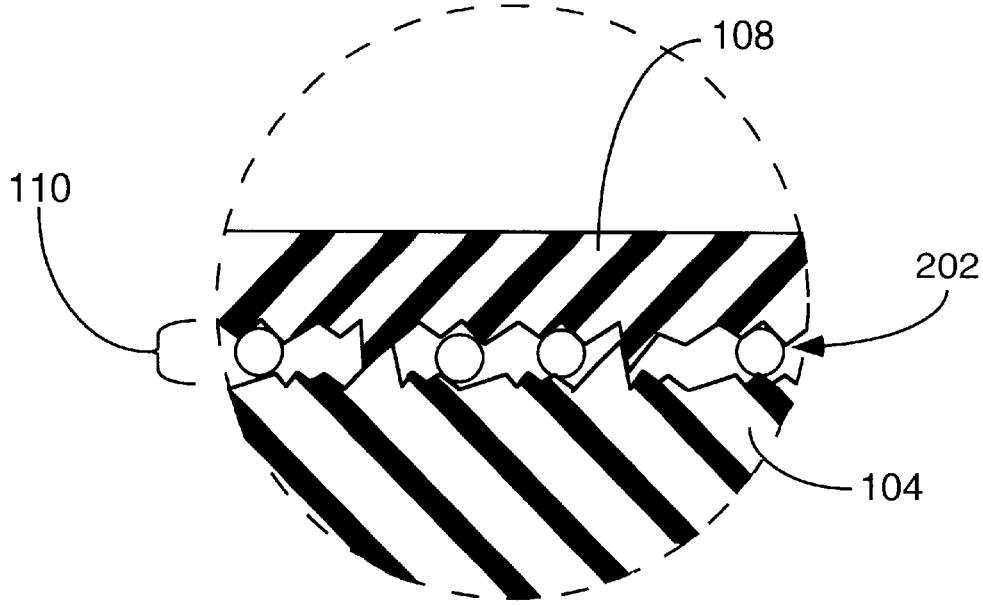
FIG. 2 depicts a detailed cross sectional view of the indicated area of FIG. 1.
Figure 4:
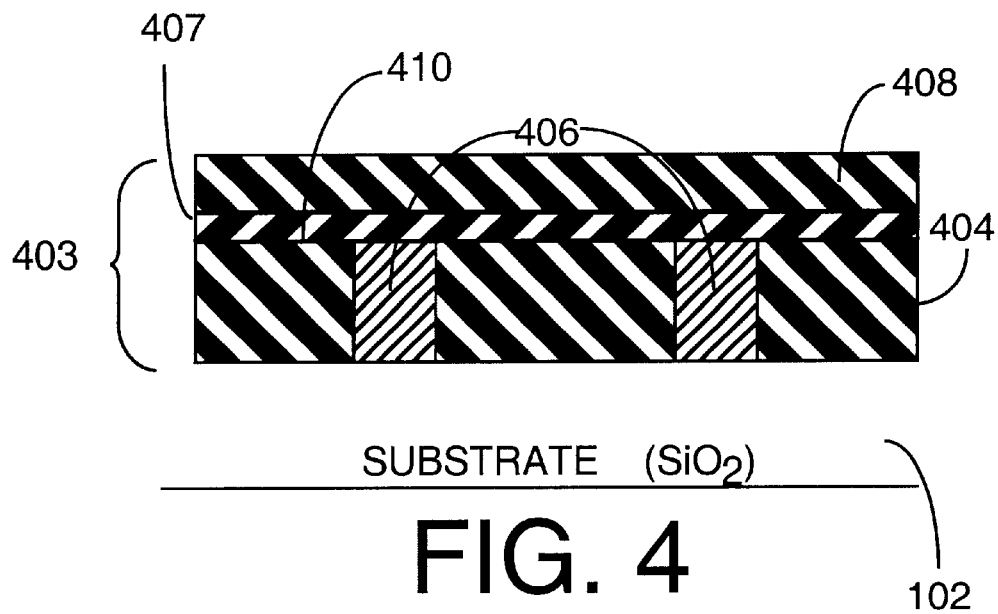
FIG. 4 depicts a partial cross sectional view of a semiconductor substrate having an integrated circuit constructed thereupon in accordance with the subject invention.

FIG. 4 depicts an integrated circuit device 400 in accordance with the present invention. The device 400 is comprised of a substrate material 402 (i.e., a dielectric material such as $SiO_2$) having a plurality of layers 403 of various materials disposed thereupon. The various layers have different electrical properties so as to create conductive pathways (also known as lines), circuit devices, and the like. These pathways and devices are linked to other devices on the substrate via a variety of other lines, interconnects and devices (not shown).

Figure 9:
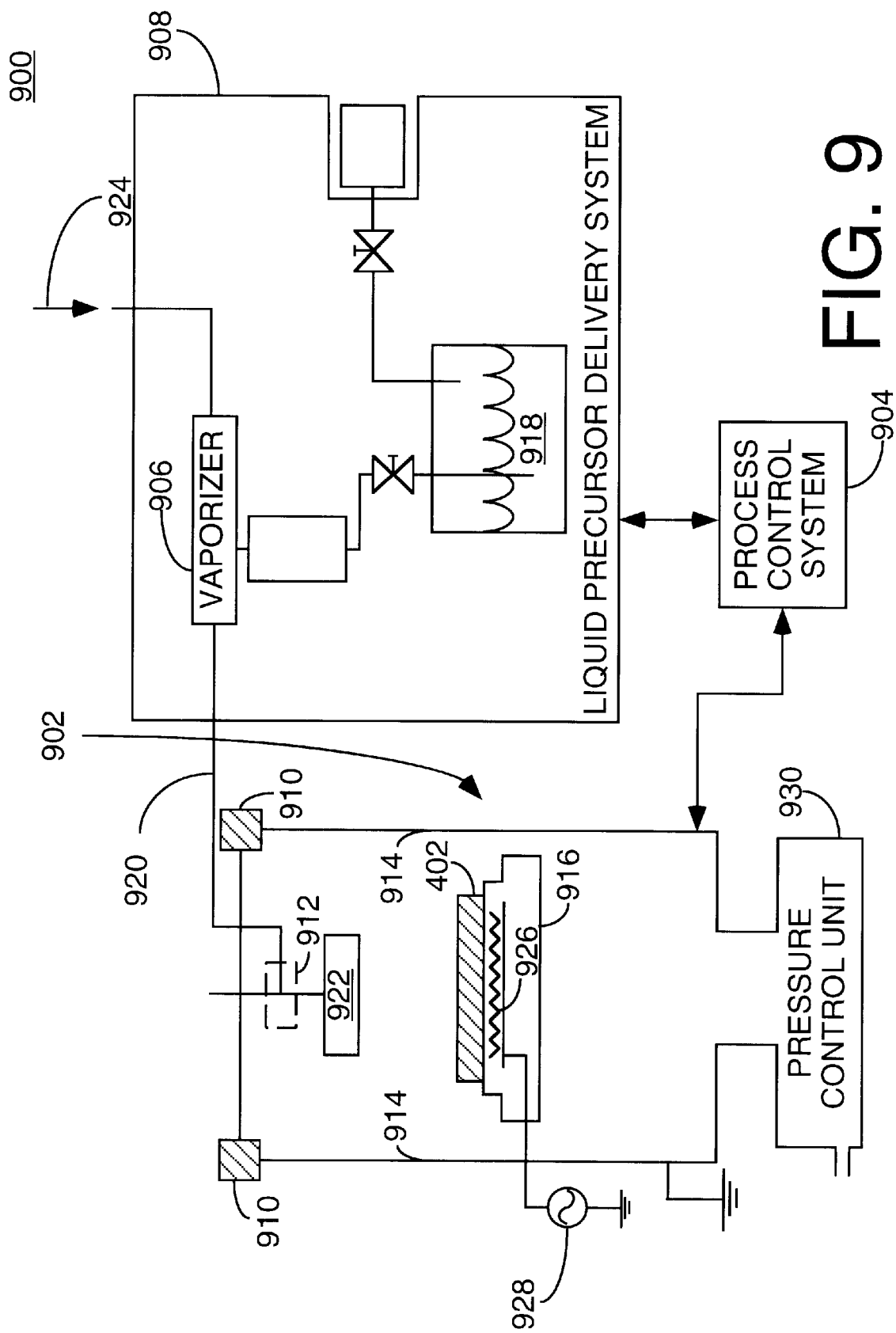
FIG. 9 depicts a deposition system used in conjunction with the the subject invention.

The device 400 is created by any known method and apparatus for fabricating integrated circuits and preferably by chemical vapor deposition (CVD). CVD and an apparatus for performing same is disclosed in U.S. Pat. No. 5,856,240 and is herein incorportated by reference. FIG. 9 depicts an exemplary deposition system 900 for performing CVD. A liquid precursor 918 is delivered to a deposition chamber 902 from a precursor delivery system 908 via one or more precursor material transfer lines 920. Specifically, the liquid precursor 918 is vaporized at vaporizer 906, mixed with a carrier gas 924 and delivered to a showerhead 922 in the deposition chamber 902. One example of a deposition chamber that can be used is a model DzX chamber manufactured by Applied Materials, Inc. of Santa Clara, Calif. The deposition chamber 902 contains a heated susceptor 916 for retaining the substrate 402 (i.e., a semiconductor wafer) onto which it is desirable to deposit the plurality of layers 403. Material is deposited onto the substrate 402 by CVD when the vaporized precursor contacts the heated substrate 402. Such processes may also be enhanced by the use of a plasma within the chamber which provides for a more uniform deposition process. The plasma is formed by driving one or more of the chamber components (i.e., the susceptor 916 or showerhead 922 with a high power energy source. For example, the energy source is an AC power source 928 connected to the susceptor 916. The chamber 902 and precursor delivery system 908 are controlled by a process control system 904.

The process chamber 902 is defined by a set of walls 914 that are electrically and thermally isolated from the susceptor 916 and showerhead 922 by isolators 910. Thermal energy, from a heating element 926 such as a resistive coil, heats a top surface of the susceptor 916. Pressure control unit 930 (i.e., a vacuum pump) adjusts the chamber atmosphere as necessary to facilitate deposition processes.

Returning to FIG. 4, a first layer 404 is an insulating layer disposed on top of the substrate 402 acting as a primary insulator. Within the insulating layer 404 are various circuit pathways or devices 406 comprised of conductive material such as titanium, copper, tantalum or the like. The first insulating layer 404 and conductive layer, disposed within a common plane, define an interface 410. A transition layer 407 is disposed upon the interface 410. Disposed above the transition layer 407, is a second insulative layer 408. Typically, the second insulative layer 408 is a dielectric material, but not necessarily the same material as the first dielectric layer 404.

The transition layer 407 is preferably a low k dielectric material. Such material has properties that enhance the bonding of the second insulative layer 408 to the first insulative layer 404. One such material that can accomplish this desired effect is BLOK™, a trademark of Applied Materials, Inc. of Santa Clara, Calif. BLOK™ stands for Barrier LOw K dielectric material and preferably has a K=4.5.

Figure 7:
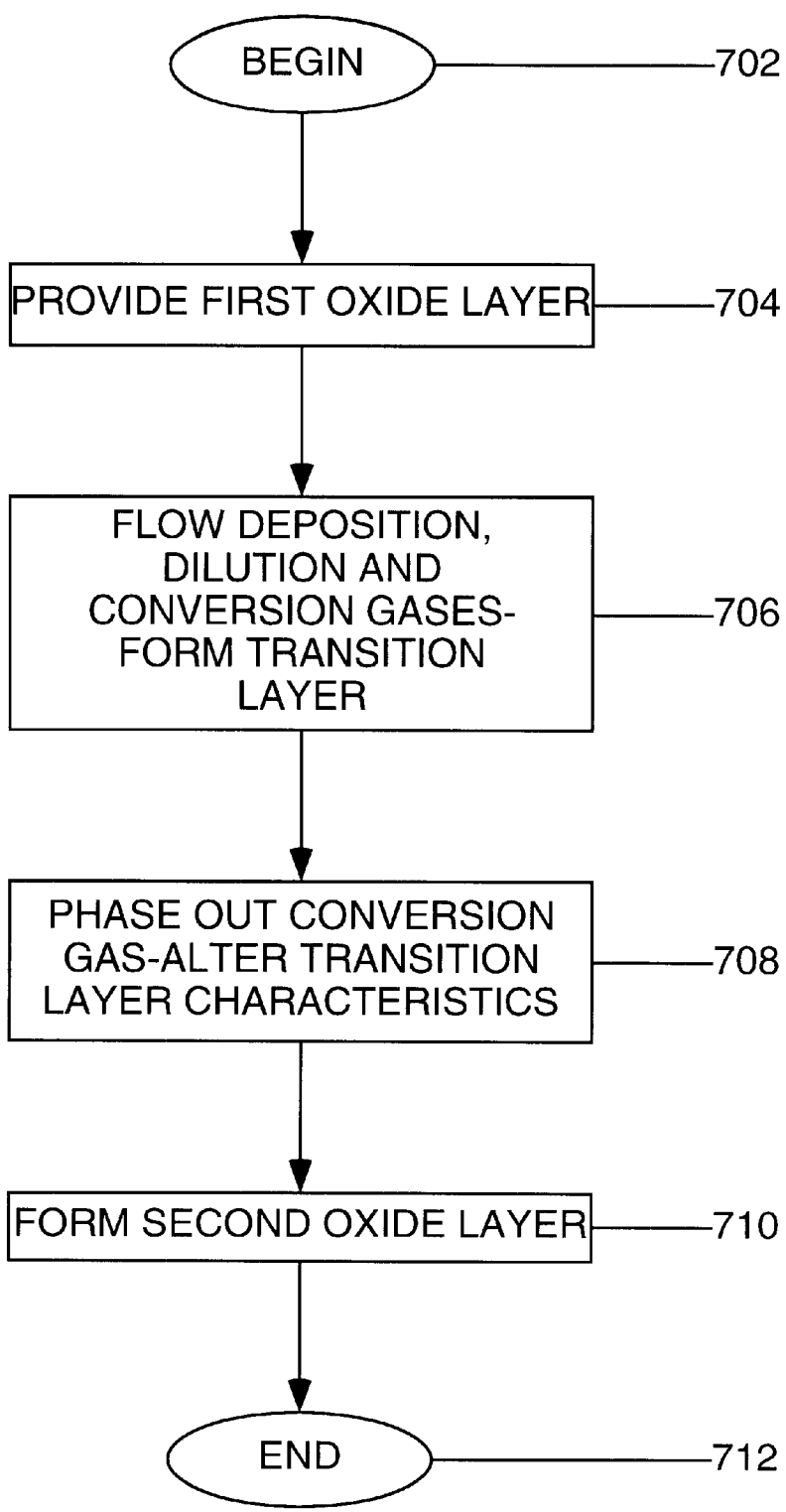
FIG. 7 depicts a series of method steps of the present invention.

The subject invention also includes a method for forming a second insulative layer upon a first insulative layer. Specifically, a first embodiment of the subject method is depicted in FIG. 7 as a series of method steps 700. The method begins at step 702 and proceeds to step 704 wherein a first insulative layer (i.e., an oxide layer) is provided on a substrate material. Said first insulative layer may be for example layer 404 disposed upon a semiconductor substrate 402 for defining conductive pathways or circuit devices upon said substrate. At step 706, a flow of deposition, dilution and conversion gases are provided to the first insulative layer. The deposition, dilution and conversion gases form a transition layer upon the first insulative layer. Said transition layer for example is layer 407 shown in FIG. 4. At step 708, the flow of conversion gas is phased out (i.e., gradually turned off or diminished over time). In phasing out the conversion gas, the characteristics of the transition layer are altered in a gradual fashion so as to improve the likelihood of adequate bonding between the transition layer and the second insulative layer. In step 710, a second insulative layer is formed upon the transition layer. The second oxide layer is, for example, layer 408 as shown in FIG. 4.

In the above discussed method 700, the deposition gas is a silicon based material and in a preferred embodiment of the invention is trimethylsilane (3MS), the dilution gas is an inert gas and in a preferred embodiment is helium. The conversion gas is an oxygen containing gas and in a preferred embodiment of the invention is $N_2O$. Additionally, the second insulative layer is a silicon based insulating layer and in a preferred embodiment of the invention is a trimethylsilane oxide layer.

The above discussed first insulative, transition, and second insulative layers are created via methods to those skilled in the art of semiconductor circuit device fabrication and include but are not limited to physical vapor deposition (PVD), chemical vapor deposition (CVD) and the like and in a preferred embodiment of the invention the subject layers are formed via CVD, and more preferably by plasma enhanced CVD (PECVD). The subject method can be practiced in a semiconductor fabrication chamber such as a DxZ chamber a manufactured and sold by Applied Materials, Inc. of Santa Clara, Calif. The conditions under which such method takes place are as follows:

T=350° C.–400° C., preferably 350C

Pressure 2–20 Torr, preferably 8.7 Torr

Power 50–500 Watts, preferably 250 Watts

Figure 8:
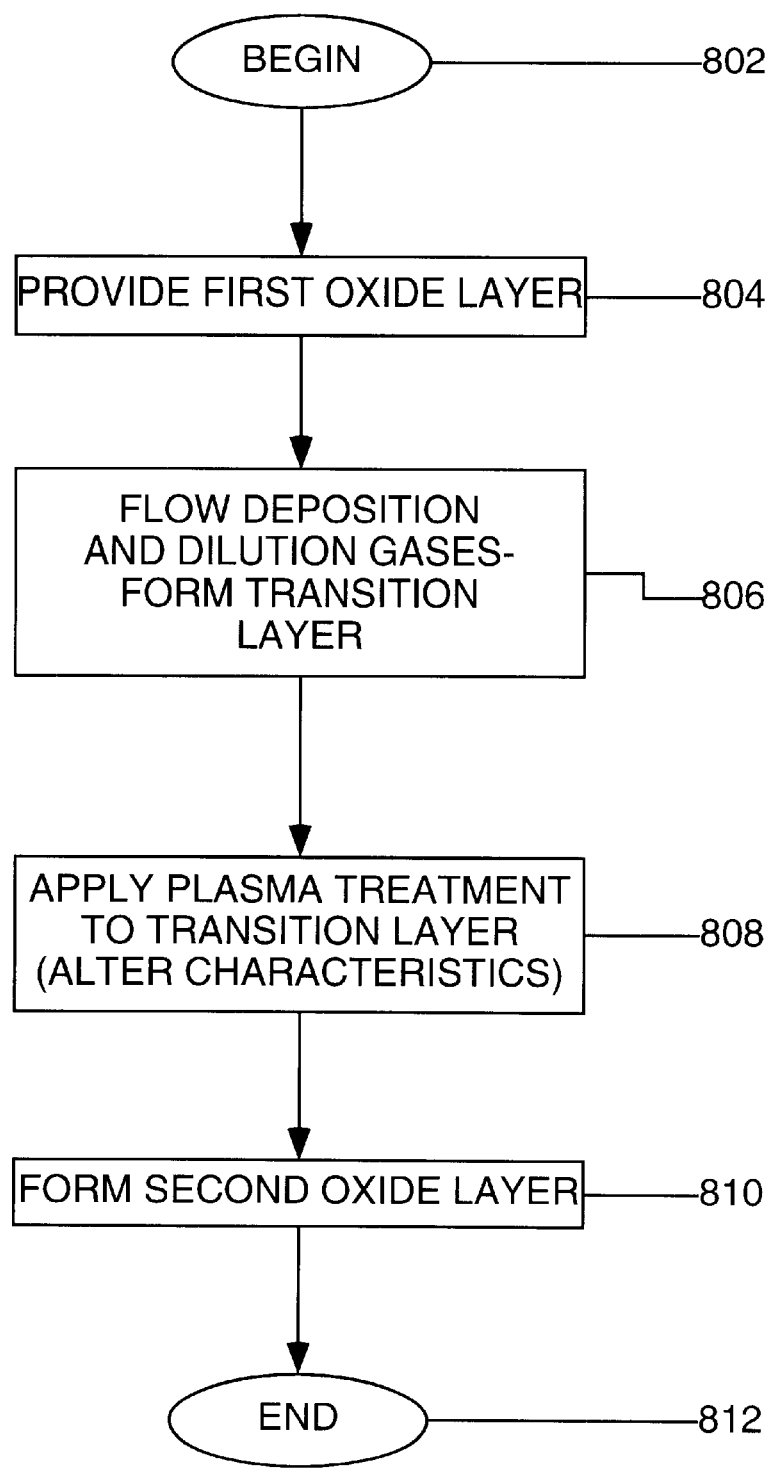
FIG. 8 depicts a series of method steps of an alternate embodiment of the present invention.

Electrode spacing 350–600 mils, preferably 435 mils
  Conversion gas flow 500–2500 sccm, preferably 1500 sccm $N_2O$ 3MS flow 25–500 sccm He flow 100–2000 sccm In an alternate embodiment of the invention depicted in FIG. 8, a series of method steps 800 is used to form a second insulative layer upon a first insulative layer. Such method steps 800 begin at step 802 and proceed to step 804 wherein a first insulative layer is provided on a substrate. At step 806, a flow of deposition and dilution gases is provided upon a first insulative layer to form a transition layer thereupon. In step 808, the flow of deposition and dilution gases is halted and a plasma treatment is applied to the transition layer. The plasma treatment alters the characteristics of the transition layer so as to improve the adhesion of the second insulative layer. At step 810, the second insulative layer is disposed upon the transition layer and the method 800 concludes at step 812.

Figure 3:
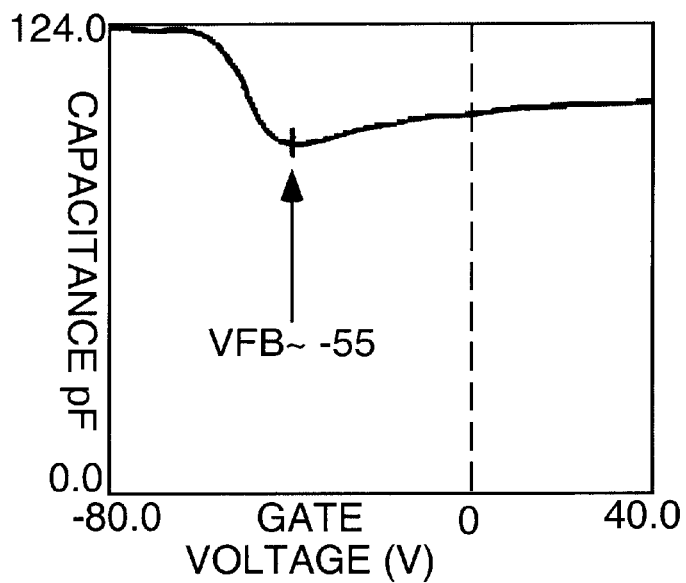
FIG. 3 depicts a graph of capacitance vs. gate voltage measures at an interface of the integrated circuit of FIG. 1.
Figure 5:
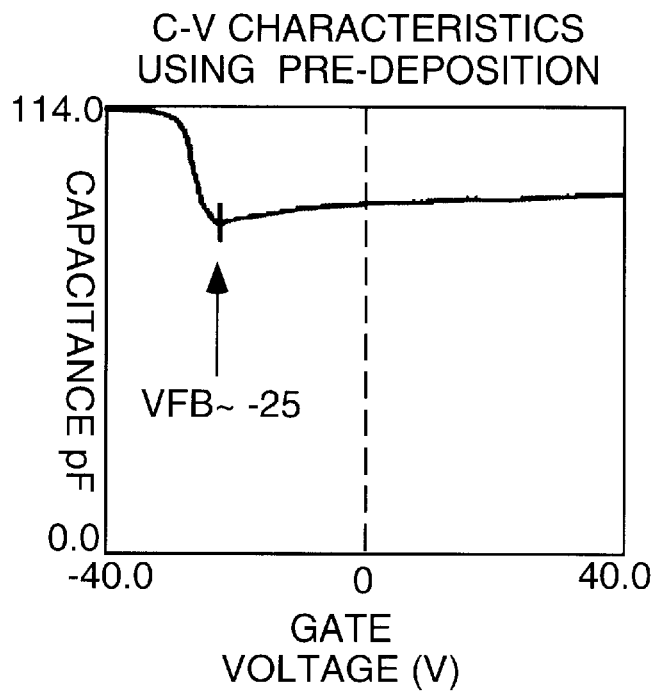
FIG. 5 depicts a graph of capacitance vs. gate voltage of the integrated circuit at an interface of the integrated circuit of FIG. 4 when using a method of the subject invention.
Figure 6:
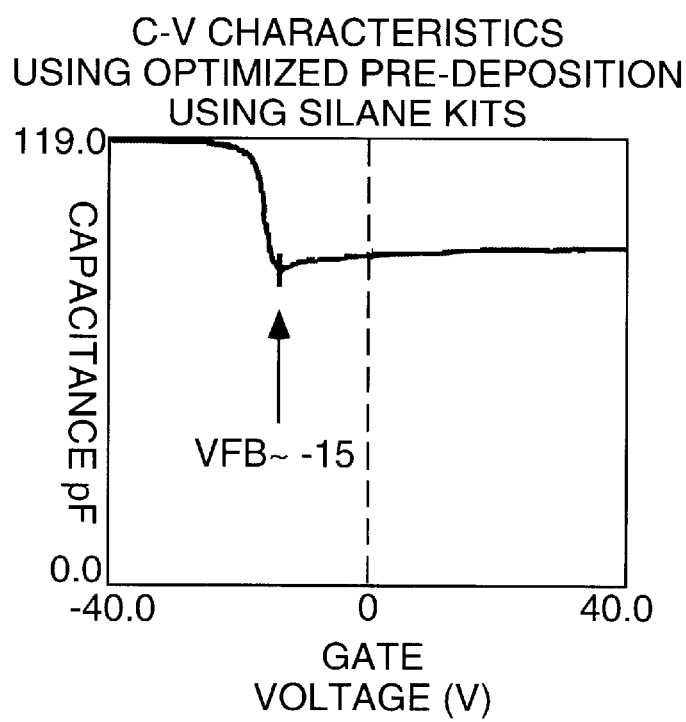
FIG. 6 depicts a graph of capacitance vs. a gate voltage of an integrated circuit of FIG. 4 when using an alternate embodiment of the method of the subject invention.

The benefits of the above-discussed apparatus are seen by comparing FIGS. 5 and 6 to FIG. 3. FIG. 5 depicts a graph of gate voltage (V) vs. capacitance (pF) for a semiconductor device formed in accordance with either of the methods disclosed. Specifically, the flatband voltage has been reduced to approximately −25V as compared to −55V of the untreated (i.e., no transition layer) device of FIG. 3. FIG. 6 depicts a graph of the same characteristic for a device that has been treated under more optimized conditions (including the use of Silane). In this device, the flatband voltage has been reduced to the typically acceptable value of −15V. A flatband voltage closer zero indicates that there are fewer charges trapped in the interface 410 of the subject invention than previously realized. As such, the device 400 is less susceptible to breakdown caused by generally poor or out-of-spec design.

Although various embodiments which incorporate the teachings of the present invention have been shown and described in detail herein, those skilled in the art can readily devise many other varied embodiments that still incorporate these teachings.

What is claimed is:

1. A method for reducing trapped charges in a semiconductor devices having a first layer and a second layer, said method comprising:

providing said first layer;

flowing a deposition gas, a dilution gas, and a conversion gas upon said first layer thereby forming a transition layer;

phasing out said flow of conversion gas; and forming said second layer upon said transition layer.

2. The method of claim 1 wherein said deposition gas is trimethylsilane.

3. The method of claim 1 wherein said dilution gas is helium.

4. The method of claim 1 wherein said conversion gas is $N_2O$.

5. The method of claim 1 wherein the step of phasing out the conversion gas flow alters the characteristics of the transition layer.

6. The method of claim 1 wherein said transition layer is formed via chemical vapor deposition.

7. The method of claim 6 wherein the transition layer is formed via plasma enhanced chemical vapor deposition.

8. The method of claim 1 wherein the first and second layers are formed via chemical vapor deposition.

9. A method for reducing trapped charges in a semiconductor device having a first layer and a second layer, said method comprising:

providing the first layer;

flowing a deposition gas and dilution gas upon said first layer to form a transition layer thereupon;

applying a plasma treatment to said transition layer; and forming said second layer upon said transition layer.

10. The method of claim 9 wherein said deposition gas is trimethylsilane.

11. The method of claim 9 wherein said dilution gas is helium.

12. The method of claim 9 wherein said plasma treatment comprises $N_2O$.

13. The method of claim 12 wherein said plasma treatment is conducted in a range of approximately 50 to 500 watts.

14. The method of claim 13 wherein the plasma treatment is conducted at 250 watts.

15. The method of claim 9 wherein said second layer is a trimethylsilane oxide layer.

16. A method for reducing trapped charges in a semiconductor device, comprising:

depositing a first dielectric layer on the device;

depositing a transition layer on the first dielectric layer, wherein the transition layer is formed by flowing trimethylsilane and helium over the first dielectric layer; and depositing a second dielectric layer on the transition layer.

17. The method of claim 16, further comprising treating the transition layer with a nitrous oxide prior to depositing the second dielectric layer.

18. The method of claim 16, wherein the second dielectric layer comprises trimethylsilane oxide.

19. The method of claim 16, wherein the first dielectric layer comprises silicon dioxide or trimethylsilane oxide.

20. The method of claims 16, wherein the trimethylsilane has a flowrate of about 25 to 500 sccm.

21. The method of claim 16, wherein the helium has a flowrate of about 100 to 2,000 sccm.

22. The method of claim 17, wherein the nitrous oxide has a flowrate of about 500 to 2500 sccm.

23. The method of claim 22, wherein the nitrous oxide flowrate is gradually reduced during the deposition of the transition layer.

24. A method for reducing trapped charges in a semiconductor device, comprising:

depositing a first layer on the device; depositing a transition layer on the first layer, wherein the transition layer is formed by flowing trimethylsilane, nitrous oxide, and helium over the first layer; and depositing a trimethylsilane oxide layer on the transition layer.

25. The method of claim 24, wherein the trimethylsilane has a flowrate of about 25 to 500 sccm.

26. The method of claim 24, wherein the helium has a flowrate of about 100 to 2,000 sccm.

27. The method of claim 24, wherein the nitrous oxide has a flowrate of about 500 to 2500 sccm.

28. The method of claim 24, wherein the nitrous oxide flowrate is gradually reduced during the deposition of the transition layer.

29. A method for reducing trapped charges in a semiconductor device, comprising:

depositing a first layer on the device;

depositing a transition layer on the first layer, wherein the transition layer is formed by flowing trimethylsilane and helium over the first layer;

treating the transition layer using a plasma comprising nitrous oxide; and then depositing a trimethylsilane oxide layer on the transition layer.

30. A method for reducing trapped charges in a semiconductor device, comprising depositing a first layer on the device;

flowing trimethylsilane, nitrous oxide, and helium over the first layer to form a transition layer, wherein the flow of the nitrous oxide is gradually reduced; and depositing a second layer on the transition layer.

* * * * *